US011525704B2

(12) United States Patent
Bonemberg et al.

(10) Patent No.: US 11,525,704 B2
(45) Date of Patent: Dec. 13, 2022

(54) SENSOR DEVICE WITH CAPACITIVE SENSOR

(71) Applicant: Robert Bosch GmbH, Stuttgart (DE)

(72) Inventors: Adam Bonemberg, Stuttgart (DE); Chris Fischer, Stuttgart (DE); Burkhard Iske, Benningen (DE); Ralf Becker, Marbach (DE)

(73) Assignee: Robert Bosch GmbH, Stuttgart (DE)

(*) Notice: Subject to any disclaimer, the term of this patent is extended or adjusted under 35 U.S.C. 154(b) by 286 days.

(21) Appl. No.: 16/913,037

(22) Filed: Jun. 26, 2020

(65) Prior Publication Data
US 2020/0408569 A1 Dec. 31, 2020

(30) Foreign Application Priority Data

Jun. 28, 2019 (DE) .................... 10 2019 209 430.9

(51) Int. Cl.
G01D 5/24 (2006.01)
G01V 3/08 (2006.01)
G06F 3/044 (2006.01)
G01R 27/26 (2006.01)
H03K 17/955 (2006.01)

(52) U.S. Cl.
CPC ....... *G01D 5/2405* (2013.01); *G01R 27/2605* (2013.01); *G01V 3/088* (2013.01); *G06F 3/044* (2013.01); *H03K 17/955* (2013.01)

(58) Field of Classification Search
CPC .... G01D 5/2405; G01D 5/24; G01R 27/2605; G01V 3/088; H03K 2217/960775; H03K 17/955; G06F 3/044
See application file for complete search history.

(56) References Cited

U.S. PATENT DOCUMENTS 9,390,061 B1   7/2016 Deeds et al.
9,594,182 B2 * 3/2017 Zibold .................. G01B 7/003

FOREIGN PATENT DOCUMENTS

| DE | 10 2009 016 355 B3 | 7/2010 |
| DE | 10 2009 057 933 B3 | 2/2011 |
| DE | 10 2009 032 357 B3 | 6/2011 |
| DE | 10 2009 057 931 A1 | 6/2011 |
| DE | 10 2010 012 961 A1 | 9/2011 |
| DE | 10 2010 030 959 A1 | 1/2012 |
| DE | 10 2010 044 820 A1 | 3/2012 |
| DE | 10 2010 041 957 A1 | 4/2012 |
| DE | 10 2010 043 519 A1 | 5/2012 |

(Continued)

OTHER PUBLICATIONS

European Search Report corresponding to European Application No. 20176984.1, dated Nov. 16, 2020 (10 pages).

*Primary Examiner* — Amy He
(74) *Attorney, Agent, or Firm* — Maginot, Moore & Beck LLP

(57) ABSTRACT

A sensor device includes a first electrode and a first signal generation device configured to apply an electrical signal to the first electrode such that the first electrode emits a first electrical field. The sensor device further includes a second electrode located at a first distance from the first electrode and configured to pick up the first electrical field. A third electrode and a second signal generation device configured to apply an electrical signal to the third electrode such that the third electrode emits a second electrical field is included in the sensor device.

7 Claims, 4 Drawing Sheets

(56) References Cited

FOREIGN PATENT DOCUMENTS

| | | |
|---|---|---|
| DE | 10 2011 002 603 A1 | 7/2012 |
| DE | 10 2011 006 743 A1 | 10/2012 |
| DE | 10 2011 078 077 A1 | 12/2012 |
| DE | 10 2011 078 534 A1 | 1/2013 |
| DE | 10 2016 217 545 A1 | 3/2018 |
| WO | WO2012059601 A1 * 5/2012 ......... G01R 27/2605 |

* cited by examiner

SENSOR DEVICE WITH CAPACITIVE SENSOR

This application claims priority under 35 U.S.C. § 119 to application no. DE 10 2019 209 430.9, filed on Jun. 28, 2019 in Germany, the disclosure of which is incorporated herein by reference in its entirety.

BACKGROUND

The present disclosure relates to a sensor device and in particular a sensor device which has a capacitive sensor. Capacitive sensors are used in many ways to detect dielectric and conductive objects in the near region of an electrical field. The capacitive effect principle is especially well suited to the detection of persons and living beings. The detection of objects can be employed for the realization of comfort functions, for example with touch-sensitive screens, or also for the realization of safety functions, for example for human-robot collaboration.

Further applications are for example filling level sensors and proximity switches which can be applied in process control.

A capacitive sensor system makes possible non-contact safety functions which initiate a safe condition even before it comes to exerting force on objects in the danger area. For this, the sensors must have a sufficiently great detection range in order to be able to take account of reaction and delay times.

In order to detect objects safely, capacitive sensor systems are suitable which work according to the principle of projected mutual capacitance and consist of pairs of electrodes where as a rule one electrode sets up or emits a variable electrical field and the induced displacement current is measured by means of a second electrode within the field. Here this kind of capacitive sensor system also captures environmental influences such as humidity, spray water in the near region of the sensor.

Beside these, temperature-conditioned expansion and compression, especially of the mechanical parts in the near region of the sensor, and also the temperature dependence of the characteristics of the circuit component parts used can also have an effect. For robust proximity detection, these influences would have to be compensated for either by limiting the applications or avoided by means of additional devices or compensated for by other appropriate measures.

For this reason, especially outdoors and/or in rapidly changing environmental conditions, for example when used in motor vehicles, the use of capacitive sensors is not very widespread.

DE 10 2016 217 545 A1 discloses the use of electrode arrangements and means to interrupt a film of water in front of a capacitive sensor, where the sensor function is preserved even when a film of water is formed in front of the sensor, for example outdoors.

U.S. Pat. No. 9,390,061 B discloses a two-sensor system, where a moveable sensor takes over the object detection and a stationary sensor is employed to detect environmental influences.

SUMMARY

The present disclosure is based on the object of making it possible to detect and compensate for environmental influences for proximity detection. For this purpose, a sensor is to be employed which works in a purely capacitive way and which particularly preferably works according to the mutual capacitance principle.

This object is achieved by an apparatus and a method according to the disclosure.

A sensor device according to the disclosure, especially a capacitive sensor device, has a first electrode as well as a signal generation device which applies an electrical signal to this first electrode, as a result of which the first electrode emits an electrical field. Further, the sensor device has a second electrode which is located at a distance from the first electrode and which is suitable and intended to pick up the electrical field emitted by the first electrode.

According to the disclosure, the sensor device has a third electrode as well as a signal generation device which applies a second electrical signal to this third electrode, with the result that the third electrode emits a further electrical field.

A first measured value (designated M1 below) can correspond or belong to the electrical field referred to which is emitted by the first electrode. A second measured value (designated M2 below) can correspond or belong to the electrical field referred to which is emitted by the third electrode.

It is therefore suggested that, in addition to the two electrodes customarily employed, a further electrode is employed which is described below and which serves especially to detect elements or disturbances in the near field region. Thus a sensor device is preferably enhanced by one or two or several additional electrodes, also designated compensation electrodes below, which particularly preferably are arranged close to the electrodes already in place and which particularly preferably enable an explicit capture of changes in the near region of the sensor or its electrodes as well as preferably also changes in the characteristics of the measurement and oscillator circuitry. This is preferably independent of object influences in the far region.

In one preferred embodiment, the first electrode and the second electrode are arranged in a common plane. In a further preferred embodiment, the first and second electrodes are arranged offset relative to each other in a direction which proceeds in the plane of at least one of the two electrodes. It is preferred then that the two electrodes are not arranged opposite each other (which for example would be the case with a capacitor).

The sensor according to the disclosure is therefore able to compensate for the influence of objects, for example of water present in the form of drops or water in the form of drops, spray or rain flowing down gutters, especially so long as no closed-over water film is present between the two electrodes first mentioned.

In a first preferred embodiment, the first electrode is a transmitter electrode which emits the electrical field referred to. As regards the electrical field, an electrostatic alternating field is preferred. The second electrode is preferably a measuring electrode which captures and/or measures the preferably electrical field emitted by the sensor electrode.

It is preferred for the third electrode to be a further transmitter electrode, which likewise emits an electrical field. This electrical field can in particular be captured by the second electrode.

In a further preferred embodiment, the sensor device has an amplifier device and in particular a signal amplifier which converts a displacement current on the second electrode or measuring electrode as unaltered as possible into a measurement signal and in particular into an evaluable and transmittable measurement signal.

In a further preferred embodiment, the sensor device has an evaluation device which processes the measurement signal. Here, this evaluation device is preferably also able to return measured values in order to signal a proximity detection, as the case may be.

In a further preferred embodiment, the apparatus also has a control device, which is described more exactly below, which administers the modes of operation referred to here, meaning the capturing of signals emitted by the first electrode and also the capturing of signals emitted by the third electrode.

In a further preferred embodiment, a circuit is provided, in particular an oscillator circuit, which emits a set signal, in particular a periodic signal. Here, this signal can for example be a square, triangular, saw-tooth or also sinusoidal wave. Preferably this signal has a sufficiently large voltage amplitude and there is also a driver capability.

In a preferred embodiment, parameters of this signal can be changed, for example the form of the signal, a frequency and/or an amplitude. Here in particular dynamic adaptation of these parameters is possible too.

In a further preferred embodiment, the sensor device is designed as a proximity sensor device and in particular is suitable and intended to capture objects in an area surrounding the sensor device. An area surrounding the sensor device is understood as a region which is less than 1 m away from the electrodes, preferably less than 80 cm, preferably less than 60 cm and particularly preferably less than 50 cm.

In a further preferred embodiment, the first and/or the second electrode is suitable and intended to pick up the electrical field emitted by the third electrode. It is particularly preferred that the second electrode is suitable and intended to pick up the electrical field. In this way, a field can be caused or a displacement current generated in the second electrode as well by the third electrode. This can likewise be determined.

In a further advantageous embodiment, the sensor device has a means of preventing a water film which is suitable and intended to prevent water films which spread between the two electrode films and/or to destroy such water films. Such means can for example be designed as a protrusion which is disposed between the two electrodes. This protrusion is preferably formed from a material which does not conduct electricity. This protrusion can extend for example perpendicularly to a geometrical connecting line which runs from one electrode to the other.

In a further advantageous embodiment, the device has a control device which sees to it that at first set time intervals the first signal is applied to the first electrode and at second set time intervals the second signal is applied to the third electrode.

It is particularly preferred that these time intervals are separated and preferably completely separated from each other. Thus it is particularly preferred that the first signal and the second signal are not emitted simultaneously. It is particularly preferred that the two signals are emitted alternately and/or cyclically. Here it is possible that the first signal is emitted in the set first time interval and subsequently the second signal is emitted in the second time interval. It is particularly preferred that the time intervals in which the second signal is emitted are shorter than the time intervals in which the first signal is emitted.

In this way account is taken of the fact that the device as a rule serves as a capture device or as a sensor device in normal use and merely from time to time to a certain extent for calibration purposes characteristic data are determined for environmental influences by means of the third electrode.

Here it is possible that the electrical signals are the same, in other words the same electrical signal is applied both to the first electrode and to the third electrode. It is however also possible that the signals applied to the first electrode differ from those applied to the third electrode.

In general, an oscillator signal is applied to the transmitter electrode and to the third electrode, also designated the combination electrode below, particularly preferably in alternation. In this way, independent measured values M1 and M2 are obtained for the two modes of operation 'first electrode activated' (M1) and 'third electrode activated' (M2). The oscillator signals can be different for the two modes of operation.

In a further preferred embodiment, the first electrode sets up an electrical field in the mode of operation (first electrode activated) which preferably extends out into the space and is changed by objects in the far region of the sensor. However, changes and objects in the near region of the sensor, for example water drops, water flowing down or the temperature-conditioned expansion of mechanical cover parts, also exert a measurable influence on the field that is set up by this first electrode. Such changes thus have a parasitic effect. Similarly, changes in the characteristics of the measurement amplification circuit and the evaluation device exert influence on the measured value with the activated first electrode.

The third electrode or compensation electrode referred to is preferably designed in such a way that this sets up a spatially concentrated field in the near region of the measuring electrode in the 'compensation electrode activated' mode of operation, as will be explained below. The value measured when the third electrode is activated is therefore predominantly influenced by changes in the near region of the measuring electrode and changes in the characteristics of the measurement amplification circuit and the evaluation device.

Thus by activating the third electrode exactly those influences are explicitly captured which must be compensated for in order to achieve detection in the far region.

In a further preferred embodiment, the third electrode is closer to the second electrode than to the first electrode. Thus it would be possible that the third electrode is integrated into the second electrode, for example built into this in an electrically or galvanically separated manner. In this way the second electrode can capture near fields of the third electrode.

It is particularly preferred that the third electrode emits an electrical field with a smaller extent than the first electrode. Thus it is particularly preferred that the third electrode serves to capture objects in a near region, in particular of the second electrode.

In a further preferred embodiment, it would also be possible that at least one electrode could operate both as a transmitter electrode and as a measuring electrode. Thus with appropriate control the first electrode for example can operate partly as a transmitter electrode and partly as a measuring electrode. It is also possible that the second electrode operates periodically as a transmitter electrode and periodically as a measuring electrode.

It would furthermore also be conceivable that physically only two electrodes are present, only that with control one electrode takes over the functions of two electrodes. In this case, one electrode is given by appropriate control activation. Preferably, however, as mentioned above, three electrodes are physically present or three electrodes which are particularly preferably electrically and/or galvanically separated from each other.

In a further advantageous embodiment, an electrode surface area of the third electrode is smaller than an electrode surface area of the first electrode and/or smaller than an electrode surface area of the second electrode.

In a further preferred embodiment, the third electrode is at least partly and particularly preferably completely surrounded by the second electrode. It is preferred that the third electrode is arranged within a surface area spanned by the second electrode.

In a further preferred embodiment, the sensor device has an evaluation device which evaluates the signals picked up by the second electrode and/or the signals emitted by the second electrode as a result of induction. Here, as mentioned above, it can be a matter especially of induced signals and/or an induced displacement current or the like.

In a further preferred embodiment, the sensor device has a fourth electrode. Thus the sensor device described above could have a first compensation electrode as well as a second compensation electrode (the fourth electrode).

Here, this fourth electrode could be placed near to the first electrode. This fourth electrode or the second compensation electrode can preferably be connected as the second measuring electrode and can pick up a further measured value, especially in the transmitter electrode or first electrode activated mode of operation.

It is particularly preferred that this fourth electrode or the second compensation electrode is configured and arranged so that a field is concentrated between the transmitter electrode and the compensation electrode spatially on the near region of the transmitter electrode.

The present disclosure is furthermore aimed at a method for operating a capacitive sensor device, in which a signal generation device applies an electrical current to a first electrode and/or provides the first electrode with an electrical signal, as a result of which the first electrode emits an electrical field, where the electrical field emitted by the first electrode is picked up with a second electrode which is located at a distance from the first electrode.

According to the disclosure, the sensor device has a third electrode as well as a signal generation device, where a further electrical field is emitted by this third electrode. It is particularly preferred that the electrical field emitted by the third electrode is also captured by the second electrode. It is preferred therefore that the third electrode also functions as a transmitter electrode.

In a preferred method, an electrical signal is applied periodically to the first electrode periodically to and the third electrode. It is particularly preferred that these periods are distinct from each other, that particularly preferably at no time is the electrical field or the electrical signal applied to both the first and the third electrode.

In a further preferred method, a first measured value is determined by means of an evaluation device, where this measured value is dependent upon the electrical field emitted by the first electrode and picked up by the second electrode and, further, a second measured value is determined which is dependent upon the field emitted by the third electrode and picked up by at least one electrode and especially by the second, and a compensated—for measured value is determined on the basis of the first measured value as well as the second measured value. Here, a mathematical method and especially a rule of three can be applied for the determination.

The disclosure thus makes it possible to achieve robust detection of approaching objects by means of capacitive sensing even in the presence of changing environmental influences thanks to an internal compensation procedure. In particular, the disclosure can be suitable for the monitoring of the surrounding area, for example, when approaching, maneuvering and parking vehicles, especially indoors and outdoors.

The disclosure can be combined, preferably for the realization of a robustly functioning and safe sensor system, with the accompanying disclosure of a capacitive three-electrode sensor for safe far-region detection and a capacitive sensor system which carries out localization independently of the surrounding area, where the three-electrode sensor proposed here can also be extended to a four-, five- or six-electrode sensor.

The disclosure provides a high robustness in detecting approaching objects in the presence of environmental influences, meaning rain, temperature fluctuations or deformations of mechanical covers in the region of a sensor and suchlike. A functional advantage is achieved in this way.

Furthermore, no special sensor system for capturing the environmental influences is required and no or only a very small amount of extra space for compensation electrodes in an existing capacitive sensor system is required. In this way integration and cost advantages are achieved.

It is particularly preferred, as mentioned above, that the third electrode or compensation electrode is small or takes up a small area compared with the transmitter electrode. It is particularly preferred that this compensation electrode is also located a short distance away from the measuring electrode.

Furthermore, it is advantageous for being able to compensate for water drops, water flowing down and mechanical hindrances especially in the near region of the sensor devices with all arrangements if the compensation electrode can function freely in the direction of the area in space in which the electrical field exists between the first electrode and the second electrode.

It is preferred that the evaluation device mentioned above carries out mathematically a compensation with set measured values of the various modes of operation, meaning normal measurement and measurement in the near region, and returns a compensated—for measured value for detection in the far region. In a preferred method, possible compensation methods are suggested.

First, a rule of three can be employed. Thus the initial value Mi of a sensor is known, which is recorded in the mode of operation with activated combination electrode without influence of objects on the reference temperature and reference humidity. A compensated—for measured value is returned by a rule of three calculation as $$M_{compensated\text{-}for} = M1 * Mi / M2$$

In a further preferred method, two-dimensional look-up tables (abbreviated LUT) can be employed. Thus the sensor device is calibrated at the beginning. For this purpose, in a first calibration step, a reference object can be placed in the far region of the sensor device in various defined positions (especially with reference temperature and reference humidity).

It is preferred that the measured values M1 and M2 arising from the calibration are then entered in a table, in particular a table of at least two dimensions, along both dimensions. The cell contents which correspond to the compensated-for measured values $M_{compensated\text{-}for}$ are each filled with the reference measured value M1 arising from the calibration.

In a further calibration step, a reference object is likewise placed in various defined positions in the far region of the sensor.

In addition, the sensor device is then exposed to the influences to be compensated for, for example spray water, temperature and humidity change or mechanical changes in the near region of the sensor. The table of values is filled further so that, in the cells for each measured value pair (M1/M2), now not the current measured value M1 is noted but rather the reference value appropriate to the position of the object arising from the first calibration step. It is preferred that the table of values generated during the calibration is stored as a look-up table and especially stored in the evaluation device mentioned above.

In the actual detection process in the far region, the table entry is looked up at the location of the updated or current measured values M1 and M2 and/or is preferably interpolated by interpolation of reference values from neighbouring fields and is returned as the compensated-for measured value $M_{compensated-for}$.

In a further possible method, a model function is applied. Here, the look-up table (see above) can be represented with a mathematical function. Additionally or optionally, it would also be possible to use some supporting points from a calibration process, especially in order to help establish parameters of the model.

A compensated-for measured value can be determined by employing current measured values in the model function. The equation $M_{compensated-for}=f(M1,M2)$ applies here.

The rule of three described above has, of the three methods referred to, the advantage that it requires the least in terms of storage and computational power, but also provides the least robust or exact results. The method described with the look-up table gives very good results with appropriate quality of the calibration data, but it requires a greater amount of storage capacity. The method with the model function described above allows a compromise of robustness, required storage capacity and computational activity which is specific to the system.

It would furthermore also be conceivable that an artificial neural net could be used as a model function and/or for elaborating a model function. Here, adaptation or training could be achieved through especially machine learning.

In such a case, the respective measured values (designated M1 and M2 below) could be used as input values and also training data, where it can be a matter of using, for instance, the reference values arising from the calibration under various environmental conditions and/or the associated position of a reference object. The output value could, once again, be a compensated-for measured value $M_{compensated-for}$.

In addition, dynamic training during operation and/or as the system is running would also be conceivable.

It is preferred that the sensor device is operated by one or more mathematical methods which assign a compensated-for measured value $M_{compensated-for}$ to the measured values M1 and M2. Here it is possible to adjust this compensated-for measured value and/or the measured values M1 and M2 by calibration or training.

BRIEF DESCRIPTION OF THE DRAWINGS

Further advantages and embodiments arise from the attached drawings, in which.

DETAILED DESCRIPTION

Figure 1:
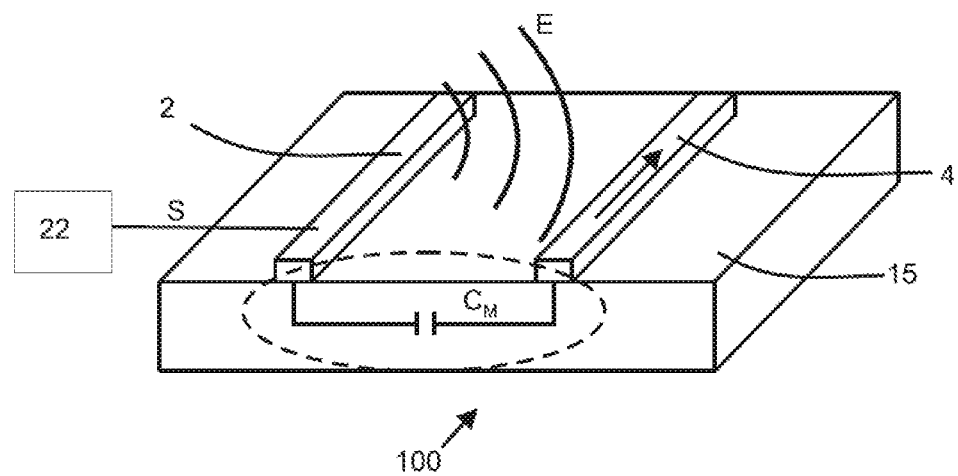
FIG. 1 shows a sensor device according to the state of the art.

FIG. 1 shows a schematic representation of a sensor device 100 according to the state of the art. This sensor device 100 has a first electrode 2 as well as a second electrode 4. These electrodes are arranged on a common carrier 15. Reference sign 22 denotes a signal generation device which emits a signal S to the first electrode 2. This signal generates an electrical field E. This electrical field E is picked up partly by the second electrode 4 and in this way a displacement current is induced which can accordingly be measured. Here, objects also have an effect on the electrical field, for example, which are in an area between electrodes 2 and 4, however also those which are present in a distant area between the two electrodes 2 and 4.

Admittedly, disturbances or objects such as water films, pollutants or the like also affect the measurement.

Figure 2:
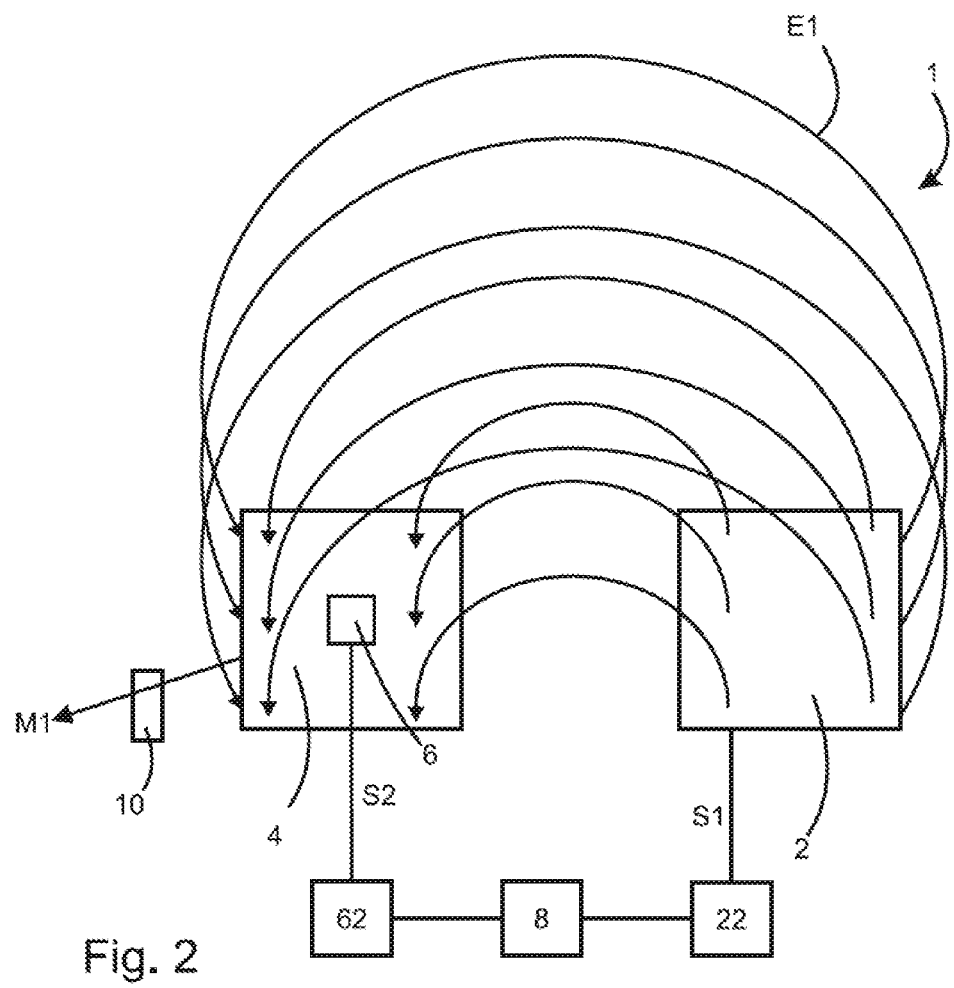
FIG. 2 shows a schematic representation of a sensor device according to the disclosure.

FIG. 2 shows in a roughly schematic way a sensor device 1 according to the disclosure. This too again has a first electrode 2 as well as a second electrode 4. Here, a signal S1 is applied to the first electrode 2 via a signal generation device 22 and generates in this way an electrical field E1. This electrical field E1 is picked up by the second electrode 4 which generates a displacement current V1 which in turn can be measured by a measurement device.

The displacement current or a signal corresponding to it can accordingly be emitted via an evaluation device 10 as first measurement signal. The evaluation device 10 therefore advantageously calculates the first measurement signal M1 from the displacement current.

Both electrodes 2 and 4 are configured in flat board form here and are preferably parallel to each other so that the electrical field lines not only extend in a straight line between the electrodes 2, 4 but assume the curved course shown in FIG. 2. In this way, objects in the far region of the two electrodes 2, 4 can also be registered, although this far region is not arranged or does not lie geometrically between the electrodes 2, 4.

It is preferred that the electrodes referred to are arranged on a common carrier. Furthermore, the signal generation device(s) can also be arranged on this carrier.

Reference sign 6 denotes a third electrode which, here, is arranged in the area of the second electrode 4. In the state shown in FIG. 2, this third electrode 6 is not provided with a signal. However, here too a signal generation device 62 is provided which can apply especially an electrical signal to the third electrode 6.

Reference sign 8 denotes a control device which effects the activation of the first electrode 2 as well as the third electrode 6 with a signal. Here, this control device can activate these two signal generation devices 22 and 62 for example at different time intervals. It is pointed out however that the control device 8 as well as the two signal generation devices 22 and 62 can also be accommodated in a common control unit.

Figure 3:
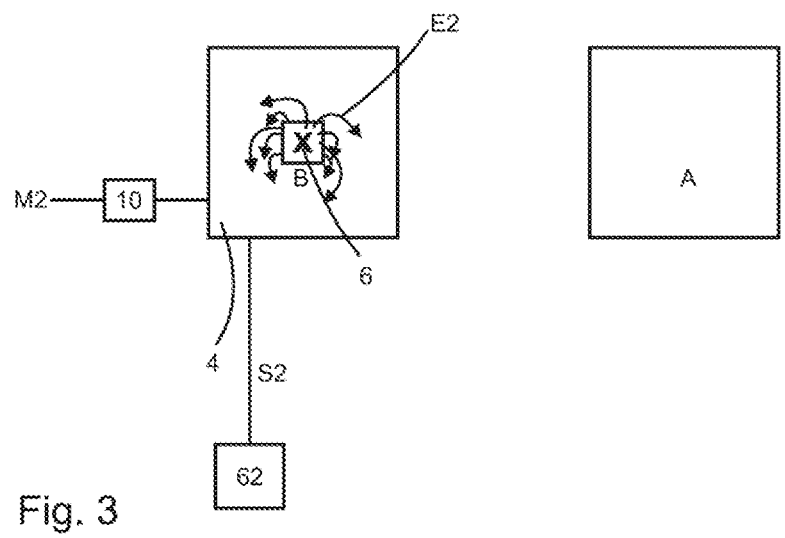
FIG. 3 shows the sensor device of FIG. 2 in a calibration condition.

FIG. 3 shows a representation of the sensor device 1 shown in FIG. 2. In the situation shown in FIG. 3, it is no longer the case that a signal is applied to the first electrode 2 but rather the third electrode 6. This likewise emits an electrical field E2, however only or in particular in the near region, with the result that this electrical field here likewise is only registered by the second electrode 4. Especially disturbances in the near region of the second electrode 4 also have an effect on this electrical field E2. The measurement signals of the third electrode 6 or the signals emitted by this can be used to capture disturbances in the near region of the sensor device or calibrate values appropriately.

Once again, a displacement current can be emitted to the evaluation device 10 in reaction to this field E2, which calculates from this a second measurement signal M2. Further, the evaluation device or a processor device (not shown) can determine a compensated-for signal $M_{compensated-for}$ from the first measurement signal M1 and the second measurement signal M2.

Figure 4:
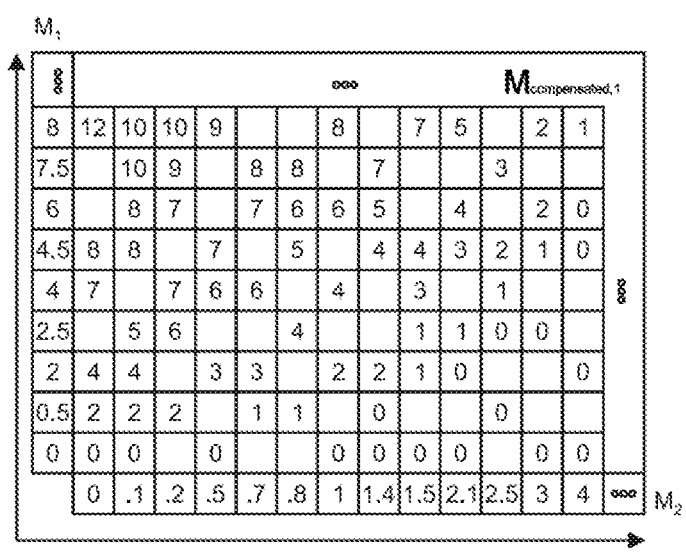
FIG. 4 shows the representation of a look-up table.

FIG. 4 shows an example of a two-dimensional look-up table. Here, the measured values M1 are plotted on the ordinate and the measured values M2 are plotted on the abscissa. The cells contain the individual compensated-for measured values $M_{compensated-for}$. By using this look-up table, where differing measured values M2 and M1 occur, compensated-for measured values $M_{compensated-for}$ can be determined in each case or can be determined by interpolation or mean-value formation.

Figure 5:
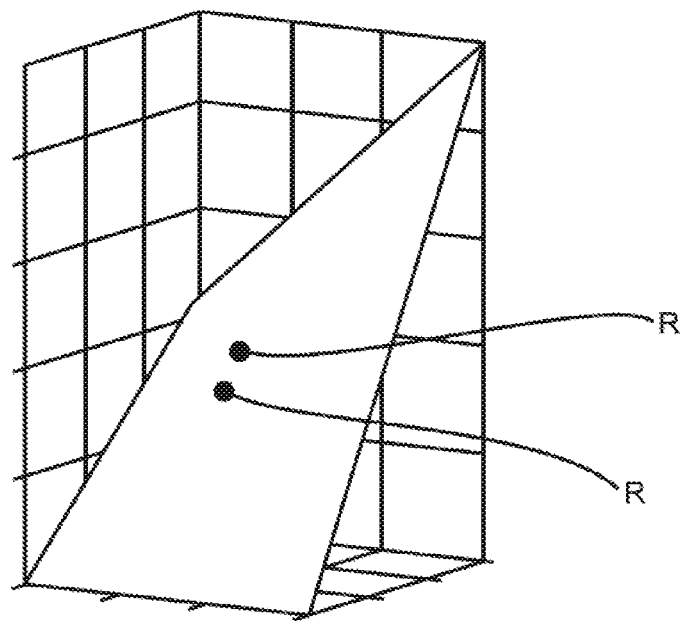
FIG. 5 shows the representation of a function for evaluating measurement results.

FIG. 5 shows a graphic representation in the context of a further measurement method. Here, a quadratic model function is set out which is applied to a two-dimensional table of values. Here, the boundary conditions are denoted by the reference signs R. As mentioned above, further supporting points can also be taken from a calibration process to help establish parameters of the model.

Besides the arrangement of the other electrode shown in FIG. 2, further arrangements of the electrodes are also conceivable.

Figure 6:
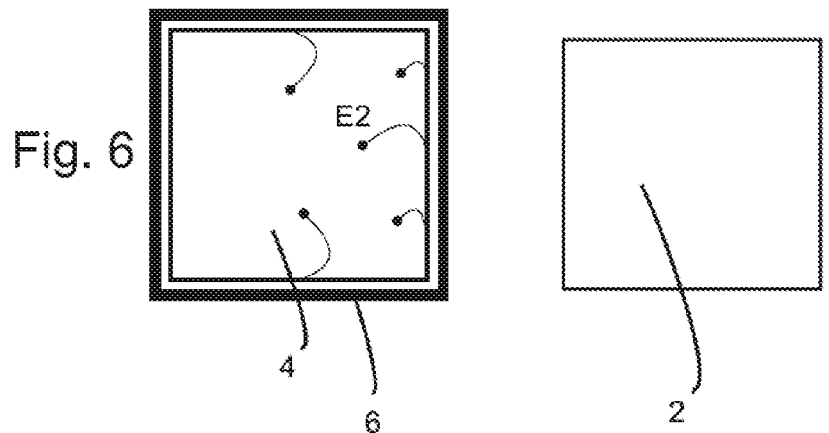
FIG. 6 shows a schematic representation of a further embodiment according to the disclosure.
Figure 7:
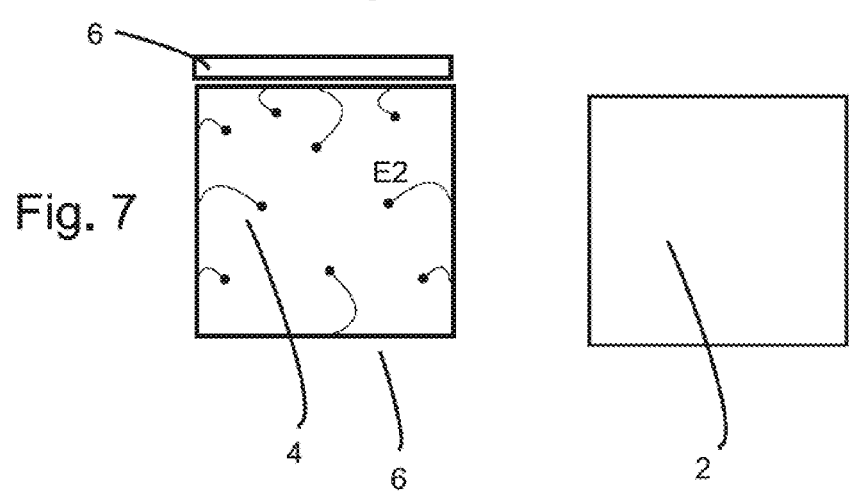
FIG. 7 shows a further schematic representation of an embodiment according to the disclosure.

So, for example, FIG. 6 shows an example in which the third electrode 6 encompasses the second electrode or measuring electrode. FIG. 7 shows a configuration in which the third electrode is positioned to the side next to the second electrode or measuring electrode. What is common to all these arrangements is however that the third electrode occupies a small area compared to the transmitter electrode or the first electrode 1 and is set a shorter distance away from the measuring electrode 4.

Besides, it is advantageous for being able to compensate for water drops, water running down and mechanical changes in the near region of the sensor device with all arrangements if the third electrode or compensation electrode can operate freely in the direction of that area in space in which the electrical field exists between the transmitter electrode and the measuring electrode. Reference signs E2 denote, as the case may be, the field lines found when measuring the electrical fields emitted by the third electrode. With the situation shown in FIG. 6 and FIG. 7, the third electrode is activated in each case and so the operating mode compensation for the environmental influence applies with the third electrode as active transmitter electrode.

Figure 8:
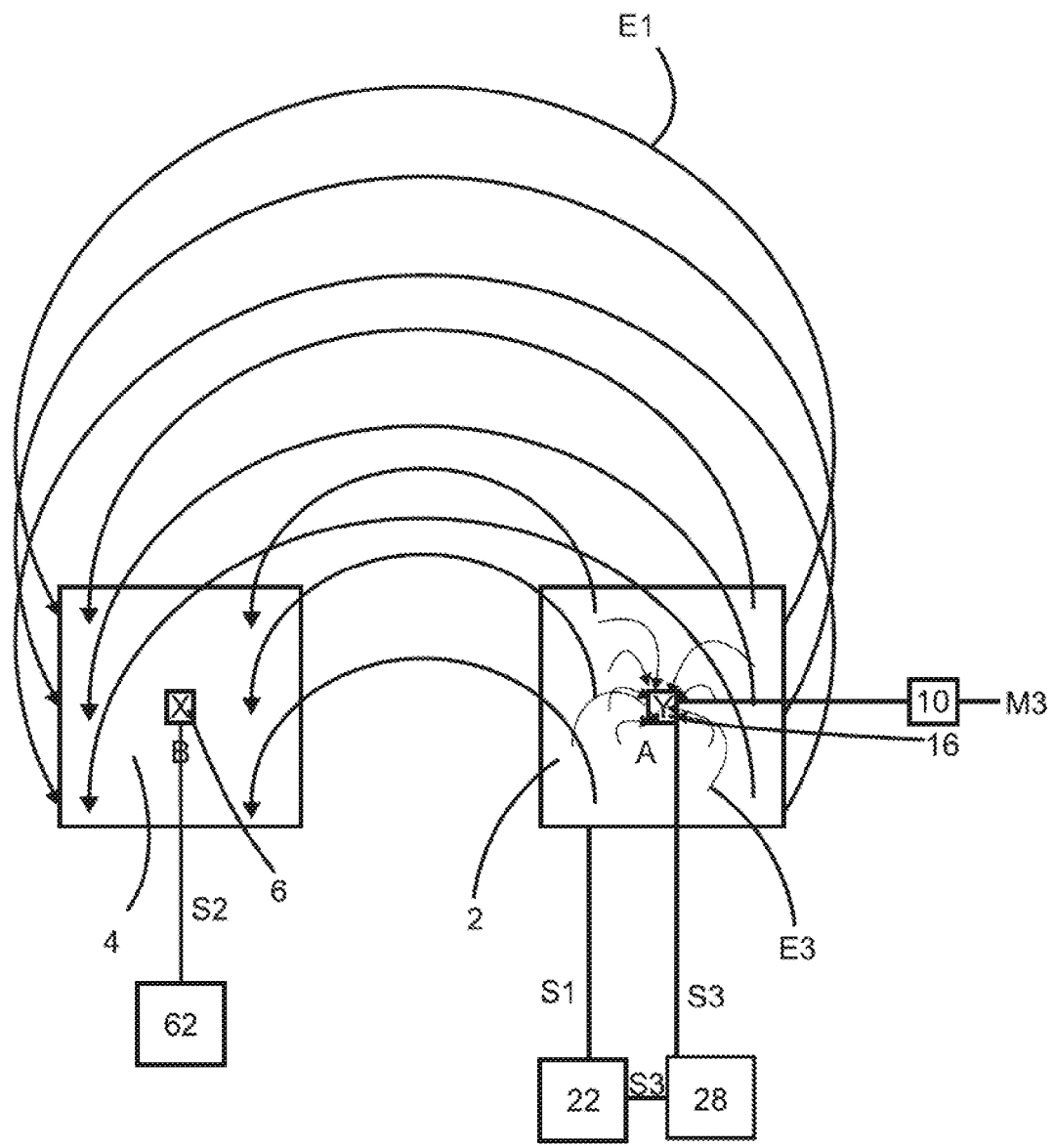
FIG. 8 shows a further schematic representation of an embodiment according to the disclosure of a sensor device.

FIG. 8 shows a further configuration of a sensor device according to the disclosure. With this configuration, the sensor device has two compensation electrodes. The sensor device with the single compensation electrode 6 is here supplemented by a second compensation electrode 16 or a fourth electrode 16. This electrode is placed near the first electrode 2, for example here within the first electrode 2.

This electrode 16 is preferably connected as the second measuring electrode and preferably picks up a measured value M3 in the "electrode 2 activated" mode of operation. Here, the fourth electrode 16 is configured and arranged so that the field between the first electrode or transmitter electrode 2 and the fourth electrode 16 is concentrated spatially on the near region of the transmitter electrode, in other words, of the first electrode 2.

Besides the configuration shown in FIG. 8, other configurations would also be possible, especially for example combinations with the configurations shown in FIGS. 6 and 7.

Two further electrodes or compensation electrodes 6, 16 are thus preferably provided with the configuration in FIG. 8 in addition to the first and second electrodes, which in this way enable near-region detection both in the region of the first electrode and in the region of the second electrode.

The applicant reserves the right to claim all features disclosed in the application documents as essential to the disclosure in so far as they are, individually or in combination, novel over the state of the art. It is further pointed out that, in the individual figures, features were also described which, taken in themselves, can be advantageous. A person skilled in the art recognizes straightaway that a particular feature described in a figure can be advantageous even without the adoption of further features from this figure. Furthermore, a person skilled in the art recognizes that advantages can also be gained through a combination of several features shown in individual or differing figures.

LIST OF REFERENCE SIGNS

1 sensor device
2 first electrode
4 second electrode
6 third electrode
8 control device
10 evaluation device
15 carrier
16 compensation electrode, fourth electrode
18, 22, 62 signal generation device
100 sensor device (state of the art)
E, E1,E2 electrical field
M1, M2, M3 measured values
$M_{compensated-for}$ compensated-for measured value
E field lines
R boundary conditions
S, S1, S2, S3 (electrical) signal
V1 displacement current

The invention claimed is:

1. A sensor device, comprising:
a first electrode;
a first signal generation device configured to apply an electrical signal to the first electrode such that the first electrode emits a first electrical field;
a second electrode located at a first distance from the first electrode and configured to pick up the first electrical field;
a third electrode;
a second signal generation device configured to apply an electrical signal to the third electrode such that the third electrode emits a second electrical field which is picked up by the second electrode; and an evaluation device configured to
- determine a first measured value, the first measured value depending on the emitted first electrical field picked up by the second electrode;
- determine a second measured value, the second measured value depending on the emitted second electrical field picked up by the second electrode; and
- determine a compensated-for measured value using the first measured value and the second measured value.

2. The sensor device according to claim 1, further comprising:
a control device configured to cause the first signal to be applied to the first electrode at first set time intervals, and configured to cause the second signal to be applied to the third electrode at second set time intervals, wherein the second set time intervals are different from the first set time intervals.

3. The sensor device according to claim 1, wherein:
the third electrode is located at a second distance from the second electrode; and
the second distance is smaller than the first distance.

4. The sensor device according to claim 1, wherein:
the first electrode has a first total surface area;
the second electrode has a second total surface area;
the third electrode has a third total surface area; and
at least one of the third total surface area is smaller than the first total surface area, and the third total surface area is smaller than the second total surface area.

5. The sensor device according to claim 1, further comprising:
a fourth electrode.

6. A method of operating a capacitive sensor device, comprising:
- applying a first electrical signal to a first electrode with a first signal generation device;
- emitting a first electrical field with the first electrode using the applied first electrical signal;
- picking up the emitted first electrical field with a second electrode located at a first distance from the first electrode;
- applying a second electrical signal to a third electrode with a second signal generation device;
- emitting a second electrical field with the third electrode using the applied second electrical signal;
- determining a first measured value with an evaluation device, the first measured value depending on the emitted first electrical field picked up by the second electrode;
- picking up the emitted second electrical field with the second electrode;
- determining a second measured value with the evaluation device, the second measured value depending on the emitted second electrical field picked up by the second electrode; and
- determining a compensated-for measured value using the first measured value and the second measured value.

7. The method according to the claim 6, wherein:
applying the first electrical signal to the first electrode comprises periodically applying the first electrical signal to the first electrode; and
applying the second electrical signal to the third electrode comprises periodically applying the second electrical signal to the third electrode.

* * * * *